United States Patent
Chou et al.

(10) Patent No.: US 10,161,976 B2
(45) Date of Patent: Dec. 25, 2018

(54) OUTPUT RESISTANCE TESTING METHOD

(71) Applicant: TAIWAN SEMICONDUCTOR MANUFACTURING COMPANY, LTD., Hsinchu (TW)

(72) Inventors: Wen-Shen Chou, Zhubei (TW); Po-Zeng Kang, Hsin-Hua (TW); Yung-Chow Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/022,687

(22) Filed: Jun. 29, 2018

(65) Prior Publication Data

US 2018/0321291 A1    Nov. 8, 2018

Related U.S. Application Data

(62) Division of application No. 14/711,900, filed on May 14, 2015, now Pat. No. 10,018,660.

(60) Provisional application No. 62/011,328, filed on Jun. 12, 2014.

(51) Int. Cl.
*G01R 27/02* (2006.01)
*G01R 27/08* (2006.01)
*G01R 31/28* (2006.01)

(52) U.S. Cl.
CPC ............ *G01R 27/025* (2013.01); *G01R 27/08* (2013.01); *G01R 31/2837* (2013.01)

(58) Field of Classification Search
CPC ... G01R 27/025; G01R 27/08; G01R 31/2837

USPC ...................................... 324/762.01
See application file for complete search history.

(56) References Cited

U.S. PATENT DOCUMENTS

| | | | |
|---|---|---|---|
| 5,670,867 A * | 9/1997 | Mitsuda | G01R 19/16519 323/312 |
| 6,963,188 B2 | 11/2005 | Wich | |
| 7,116,113 B1 | 10/2006 | Thomspsen et al. | |
| 7,724,077 B2 | 5/2010 | Bien | |
| 7,960,997 B2 | 6/2011 | Williams | |
| 8,409,867 B2 | 4/2013 | Bansal et al. | |
| 8,405,442 B2 | 5/2013 | Chen | |
| 8,436,671 B2 | 5/2013 | Chern et al. | |
| 8,610,488 B2 | 12/2013 | Yu et al. | |
| 8,625,240 B2 | 1/2014 | Chung et al. | |
| 8,847,659 B1 | 9/2014 | Lan et al. | |
| 9,433,035 B2 | 8/2016 | Nagaoka et al. | |
| 2014/0266386 A1 | 9/2014 | Huang et al. | |

* cited by examiner

*Primary Examiner* — Melissa Koval
*Assistant Examiner* — Rahul Maini
(74) *Attorney, Agent, or Firm* — Hauptman Ham, LLP

(57) ABSTRACT

A method of measuring an output resistance of a DUT includes determining an initial output resistance of an n-type transistor, thereby determining an initial gate voltage for the n-type transistor, and determining an initial output resistance of a p-type transistor, thereby determining an initial gate voltage for the n-type transistor. A resistance for a cascode arrangement of the n-type transistor and the p-type transistor is determined, and the output resistance of the DUT using the cascode arrangement is measured by biasing the n-type transistor with the initial gate voltage for the n-type transistor and biasing the p-type transistor with the initial gate voltage for the p-type transistor.

20 Claims, 8 Drawing Sheets

OUTPUT RESISTANCE TESTING METHOD

PRIORITY CLAIM

The present application is a divisional of U.S. application Ser. No. 14/711,900, filed May 14, 2015, which claims the priority of U.S. Application No. 62/011,328, filed Jun. 12, 2014, which are incorporated herein by reference in their entireties.

BACKGROUND

Output resistance of a device under test (DUT) is used to determine a change in current within the DUT. As the output resistance increases, the change in current within the DUT decreases when the output voltage changed a fixed amount. A high output resistance helps to maintain consistent performance of the DUT by providing a more stable current to components within the DUT. Output resistance is measured to help determine whether the DUT will function consistently and precisely during operation.

In some approaches, output resistance is measured using a measurement tool connected to a single transistor. A voltage between a gate of the transistor and a source of the transistor, Vgs, is maintained at a constant value. Then, a voltage between a drain of the transistor and the source of the transistor, Vds, is swept through a range of voltage values. A change in current is measured as the Vds is swept through the range of voltage values, and the output resistance is calculated based on a sweep range of the Vds and the measured change in current.

In some approaches, output resistance is measured using a measurement tool connected to a single transistor connected in parallel with a current source. Similar to the single transistor approach, the Vgs is maintained at a constant value and the Vds is swept through a range of voltage values. The current source is a high magnitude fixed bias current to the transistor. The output resistance is calculated in a similar manner as the single transistor approach.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
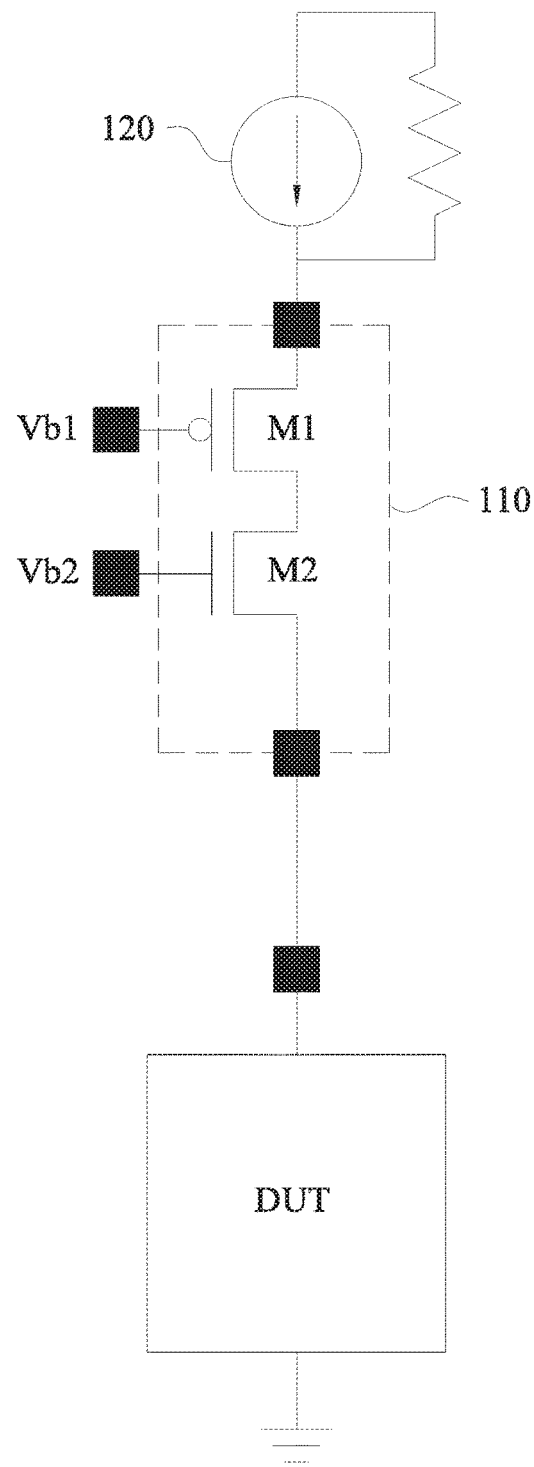
FIG. 1 is a schematic diagram of an arrangement for measuring an output resistance in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic diagram of an arrangement 100 for measuring an output resistance in accordance with some embodiments. Arrangement 100 includes a device under test DUT connected to a testing structure 110. A current source 120 is configured to provide a current through testing structure 110 for measuring an output resistance of the DUT. Testing structure 110 includes a first cascode transistor M1 having a first dopant type. A second cascode transistor M2 is connected between first cascode transistor M1 and the DUT. Second cascode transistor M2 has a second dopant type opposite to the first dopant type. In some embodiments, testing structure 110 includes additional cascode transistors connected in series with first cascode transistor M1 and second cascode transistor M2. As a number of cascode transistors increases, accuracy of the output resistance measurement increases; however, a size of testing structure 110 also increases. In some embodiments, testing structure 110 is part of a same integrated circuit as the DUT. In some embodiments, testing structure 110 is separable from the DUT.

First cascode transistor M1 includes a first terminal connected to current source 120. First cascode transistor M1 includes a second terminal connected to second cascode transistor M2. A gate of first cascode transistor M1 is configured to receive a first voltage Vb1. In some embodiments, first cascode transistor M1 is a p-type metal-oxide semiconductor (PMOS) transistor. In some embodiments, first cascode transistor M1 is an n-type metal-oxide-semiconductor (NMOS) transistor.

Second cascode transistor M2 includes a first terminal connected to the DUT. Second cascode transistor M2 includes a second terminal connected to first cascode transistor M1. A gate of second cascode transistor M2 is configured to receive a second voltage Vb2. In some embodiments, second cascode transistor M2 is a PMOS transistor. In some embodiments, second cascode transistor M2 is an NMOS transistor. The dopant type of second cascode transistor M2 is opposite to that of first cascode transistor M1, i.e., if first cascode transistor M1 is PMOS, then second cascode transistor M2 is NMOS.

By using two cascode transistors, an input of testing structure 110 is isolated from an output of the testing structure. This isolation helps to reduce the Miller effect, which increases a bandwidth of testing structure 110 and facilitates use of the testing structure for a wider range of DUTs. In some embodiments, at least one additional cascode transistor is added to testing structure 110. In some embodiments, the additional cascode transistor has a same dopant type as first cascode transistor M1. In some embodiments, the additional cascode transistor has a same dopant type as second cascode transistor M2. In some embodiments, the additional cascode transistor is connected between first cascode transistor M1 and second cascode transistor M2. In some embodiments, the additional cascode transistor is connected between the DUT and second cascode transistor M2. In some embodiments, the additional cascode transistor is connected between current source 120 and first cascode transistor M1.

The use of two cascode transistors also increases a maximum measurable output resistance. In some approaches which include a single transistor, or a single transistor in combination with a current source, a maximum output resistance which is able to be accurately measured is approximately 1 mega-ohm (MΩ). Using such an approach with a DUT which has a higher output resistance causes results which have a lower degree of accuracy in contrast with the use of two cascode transistors as in arrangement 100.

In operation, testing equipment is attached to testing structure 110 between first cascode transistor M1 and second cascode transistor M2. The testing equipment is capable of sweeping a voltage at a node between first cascode transistor M1 and second cascode transistor M2 across a range of voltages. In some embodiments, the testing equipment is configured to apply two distinct voltage levels to the node. In some embodiments, the testing equipment is configured to apply more than two distinct voltage levels to the node. In some embodiments, the testing equipment is capable of applying a voltage to the gate of first cascode transistor M1. In some embodiments, the testing equipment is capable of applying a voltage to the gate of second cascode transistor M2. In some embodiments, the testing equipment is capable of connecting the gate of first cascode transistor M1 to the first terminal or the second terminal of the first cascode transistor. In some embodiments, the testing equipment is capable of connecting the gate of second cascode transistor M2 to the first terminal or the second terminal of the second cascode transistor.

Current source 120 is configured to provide a reference current to testing structure 110. In some embodiments, the reference current is a temperature independent reference current. In some embodiments, current source 120 is a current mirror. In some embodiments, current source 120 is part of a same integrated circuit as testing structure 110. In some embodiments, current source 120 is separable from testing structure 110.

Figure 2:
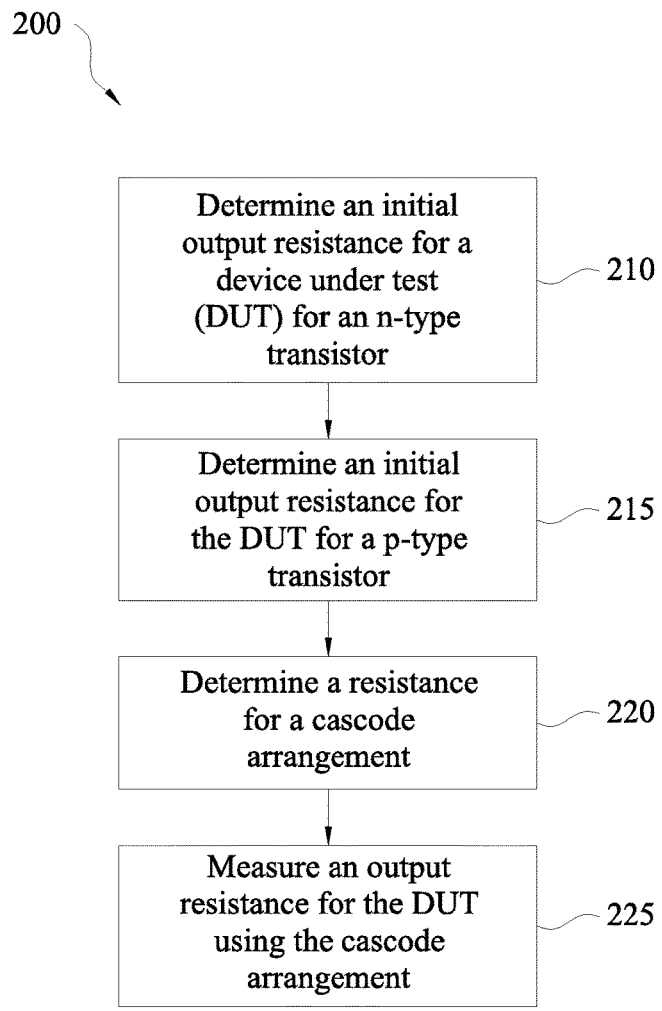
FIG. 2 is a flow chart of a method of measuring an output resistance in accordance with some embodiments.
Figure 3:
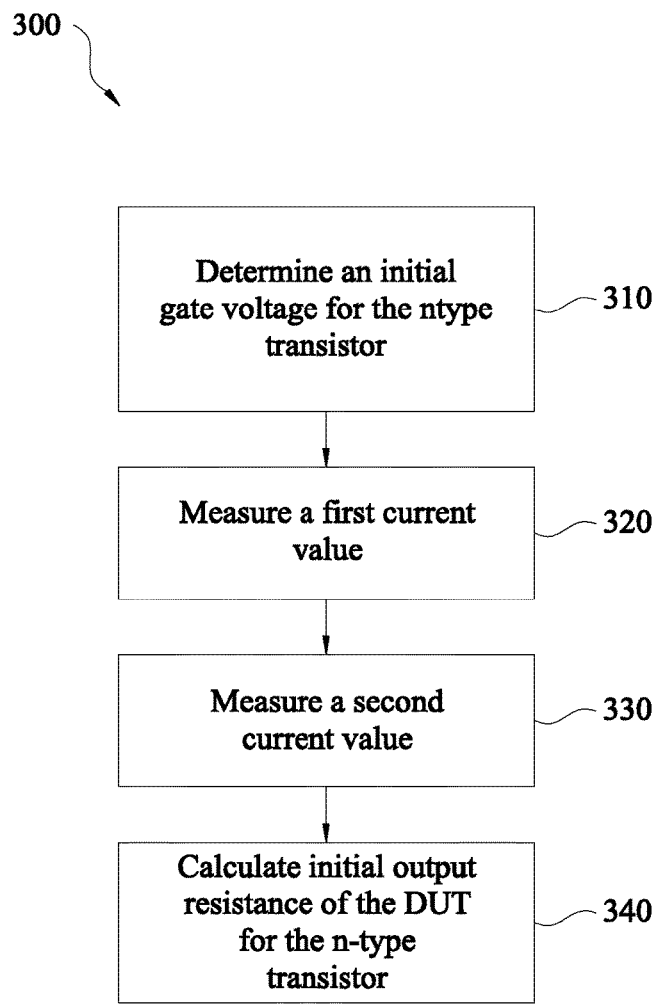
FIG. 3 is a flowchart of a method for measuring an initial output resistance of a DUT for an n-type transistor in accordance with some embodiments.

FIG. 2 is a flowchart of a method 200 of measuring an output resistance in accordance with some embodiments. In operation 210, an initial output resistance of a DUT is measured for an n-type transistor of a testing structure. In some embodiments, the n-type transistor of the testing structure is M2 of testing structure 110. The initial output resistance of the DUT for the n-type transistor is measured using method 300 (FIG. 3), in some embodiments. FIG. 3 is a flowchart of a method 300 for measuring an initial output resistance of an n-type transistor. In operation 310, an initial n-type gate voltage is determined. The initial n-type gate voltage is determined for the n-type transistor by connecting the n-type transistor as indicated in FIG. 4A, in some embodiments.

Figure 4A:
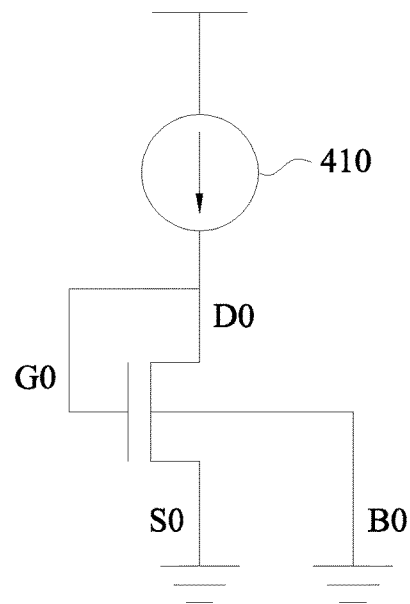
FIGS. 4A and 4B are schematic diagrams of connections within an arrangement during the method of measuring the output resistance in accordance with some embodiments.

In FIG. 4A, the n-type transistor is configured to receive a reference current from a reference current generator 410 at a drain terminal. The reference current has a sufficient magnitude to maintain the DUT in a saturation region. In some embodiments, the reference current is equal to about 2 microamps (µA) multiplied by a ratio of a gate width and a gate length of a core transistor of the DUT, i.e., Iref=2 µA*(W0/L0), where Iref is the reference current, W0 is the gate width of the core transistor of the DUT and L0 is the gate length of the core transistor of the DUT. In some embodiments, the reference current is greater than or less than 2 µA*(W0/L0).

A gate of the n-type transistor is connected to the drain terminal. In some embodiments, the gate of the n-type transistor is connected to the drain terminal using testing equipment. In some embodiments, the testing equipment is used to provide a same voltage level to both the gate and the drain terminal of the n-type transistor. In some embodiments, a programmable e-fuse is used to connect the gate to the drain terminal, so that the e-fuse can be blown during subsequent use of the n-type transistor.

A source terminal and a bulk terminal of the n-type transistor are connected to a reference voltage. In some embodiments, the reference voltage is a ground voltage. In some embodiments, the reference voltage is different from the ground voltage. In some embodiments, the reference voltage is supplied to the source terminal and the bulk terminal by the testing equipment. In some embodiments, a programmable e-fuse is used to connect the source terminal or the bulk terminal to the reference voltage.

A voltage at the gate terminal of the n-type transistor is measured as Vg0, to determine the initial n-type gate voltage. The Vg0 value is stored for later use. In some embodiments, the Vg0 value is stored in a non-transitory computer readable medium connected to the testing equipment. In some embodiments, the Vg0 value is stored in a non-transitory computer readable medium separable from the testing equipment, and the non-transistor computer readable medium is able to communicate the Vg0 value to the testing equipment.

Figure 4B:
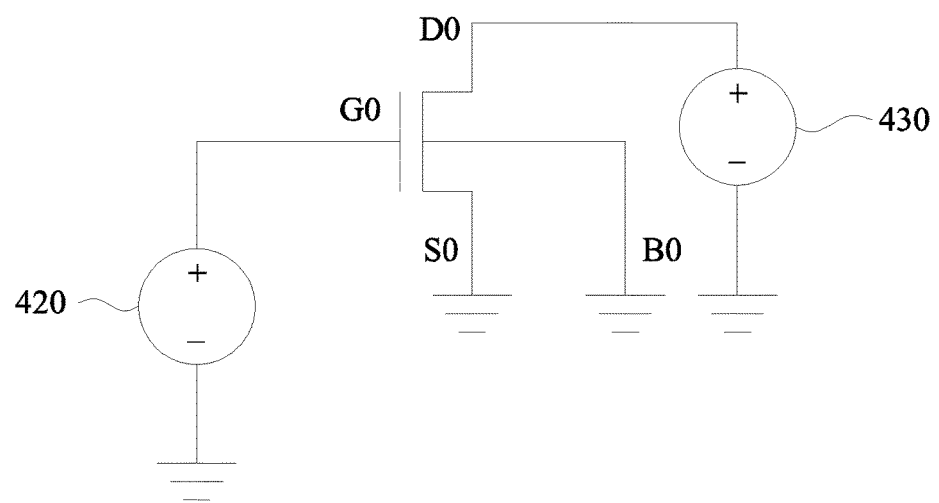

In operation 320, a first current value is measured. The first current value is measured by adjusting connections of the n-type transistor. In some embodiments, the connections are adjusted according to FIG. 4B. In FIG. 4B, the gate and the drain terminal of the n-type transistor are disconnected. In some embodiments, the gate and the drain terminal are disconnected using the testing equipment. In some embodiments, the gate and the drain terminal are disconnected by blowing an e-fuse. The source terminal and the bulk terminal remain connected to the reference voltage. The drain terminal is a voltage sweeping unit 430. In some embodiments, voltage sweeping unit 430 is part of the testing equipment. The Vg0 voltage value is applied to the gate by a voltage source 420. In some embodiments, voltage source 420 is part of the testing equipment. The testing equipment is used to set a voltage level at the drain terminal equal to Vg0. A current across the n-type transistor, I01, is measured to as the first current value.

In operation 330, a second current value is measured. The second current value is measured by increasing the voltage level from voltage sweeping unit 430 applied to the drain terminal of the n-type transistor by a known value. In some embodiments, the known value is a pre-determined value. In some embodiments, the known value is selected by a user of the testing equipment during operation. In some embodiments, the known value is about 100 millivolts (mV). In some embodiments, the known value is more or less than 100 mV. In some embodiments, the voltage level of voltage sweeping unit 430 is adjusted using the testing equipment. In some embodiments, the known value is stored in the testing equipment. A current across the n-type transistor, I02, is measured as the second current value.

In operation 340, the initial output resistance is calculated. In some embodiments, the initial output resistance is calculated by the testing equipment. In some embodiments, the initial output resistance is calculated by a separate processing unit capable of communication with the testing equipment. The initial output resistance is calculated by dividing the known value by a difference between the second current value and the first current value, i.e., Rout0=K/(I02−I01), where Rout0 is the initial output resistance and K is the output voltage change (V02−V01).

Figure 5:
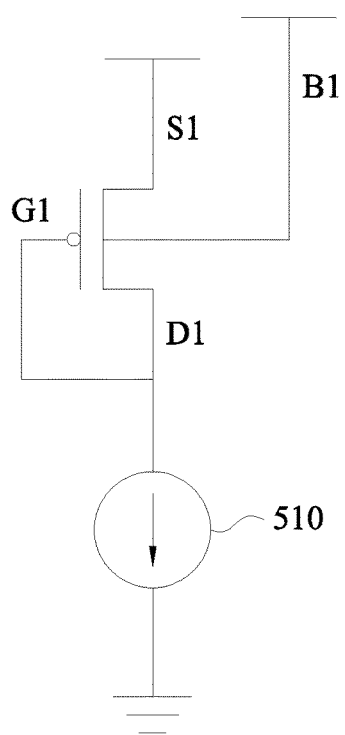
FIG. 5 is a schematic diagram of connections within an arrangement during the method of measuring the output resistance in accordance with some embodiments.

Returning to method 200, the method continues with operation 215 in which an initial output resistance for the DUT for a PMOS is determined. The initial p-type gate voltage is determined for the n-type transistor by connecting the n-type transistor as indicated in FIG. 5, in some embodiments. In FIG. 5, the p-type transistor is configured to receive a supply voltage at a source terminal and at a bulk terminal. In some embodiments, the supply voltage is equal to about a I/O supply voltage of the DUT. In some embodiments the I/O supply voltage of the DUT is about 1.8 V. In some embodiments, the I/O supply voltage of the DUT is greater than or less than 1.8V.

A gate of the p-type transistor is connected to a drain terminal of the p-type transistor. In some embodiments, the gate of the p-type transistor is connected to the drain terminal using the testing equipment. In some embodiments, the testing equipment is used to provide a same voltage level to both the gate and the drain terminal of the p-type transistor. In some embodiments, a programmable e-fuse is used to connect the gate to the drain terminal, so that the e-fuse can be blown during subsequent use of the p-type transistor.

A current source 510 is connected to the drain terminal of the p-type transistor. The reference current from operation 210 is applied to the drain terminal of the p-type transistor by the testing equipment.

A voltage at the gate of the p-type transistor is measured as Vg1 to determine an initial p-type gate voltage. The Vg1 value is stored for later use. In some embodiments, the Vg1 value is stored in a non-transitory computer readable medium connected to the testing equipment. In some embodiments, the Vg1 value is stored in a non-transitory computer readable medium separable from the testing equipment, and the non-transistor computer readable medium is able to communicate the Vg1 value to the testing equipment.

In some embodiments, operation 210 is performed simultaneously with operation 215. In some embodiments, operation 210 is performed sequentially with operation 215.

Figure 6:
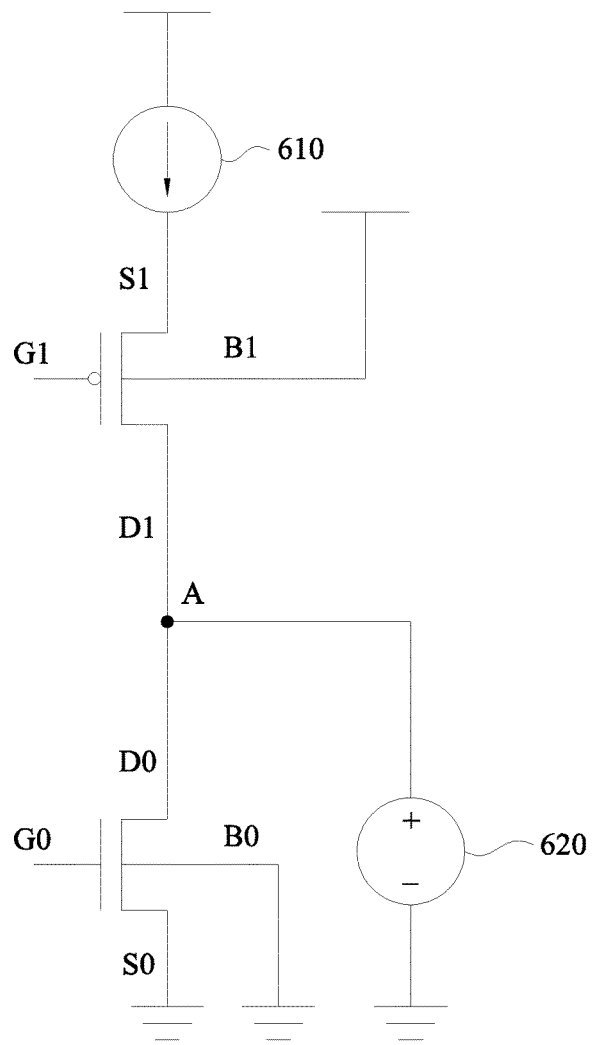
FIG. 6 is a schematic diagram of connections within an arrangement during the method of measuring the output resistance in accordance with some embodiments.

Method 200 continues with operation 220, in which a resistance for the DUT is determined for a cascode arrangement. The resistance of the cascode arrangement is determined by connecting the n-type transistor and the p-type transistor as indicated in FIG. 6, in some embodiments. In FIG. 6, the p-type transistor is configured to receive the supply voltage at the source terminal and at the bulk terminal. The n-type transistor is configured to receive the reference voltage at the source terminal and the bulk terminal.

The gate of the p-type transistor is configured to receive the Vg1 voltage value. In some embodiments, the testing equipment is used to supply the Vg1 voltage value to the gate of the p-type transistor. The gate of the n-type transistor is configured to receive the Vg0 voltage value. In some embodiments, the testing equipment is used to supply the Vg0 voltage value to the gate of the n-type transistor.

The drain terminal of the p-type transistor is connected to the drain terminal of the n-type transistor at a node A. A voltage source 620 is connected to the p-type transistor and the n-type transistor at node A. In some embodiments, voltage source 620 is part of the testing equipment.

In some embodiments, a current source 610 is connected to the source terminal of the p-type transistor. The reference current of operation 210 is applied to the source terminal of the p-type transistor and a voltage level at the source terminal of the p-type transistor is measured to determine the output resistance of the DUT using cascode arrangement. In some embodiments, current source 610 is connected to the source terminal of the n-type transistor. The reference current of operation 210 is applied to the source terminal of the n-type transistor and a voltage level at the source terminal of the n-type transistor is measured to determine the output resistance of the DUT using the cascode arrangement.

Figure 7:
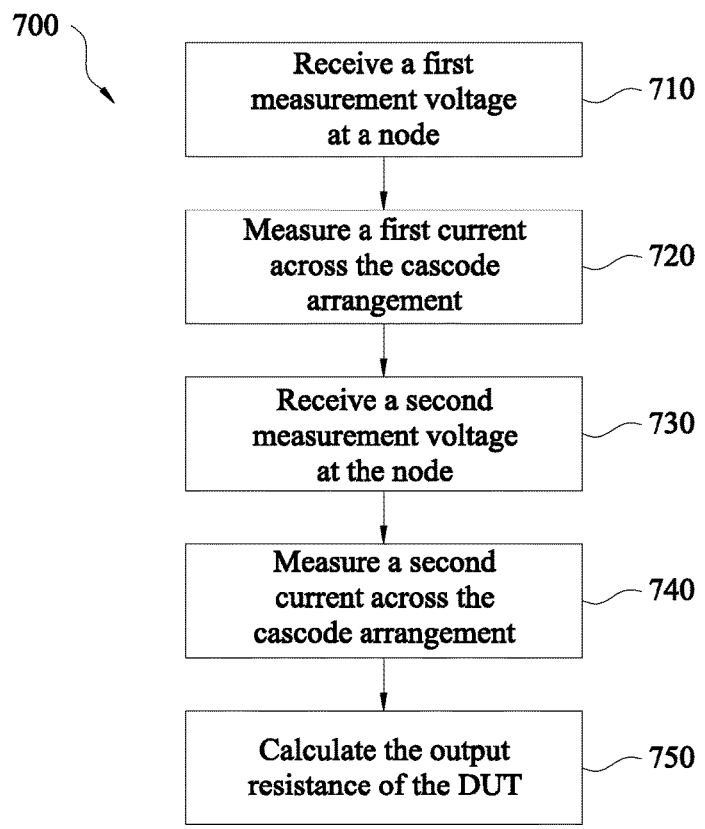
FIG. 7 is a flowchart of a method of measuring an output resistance of a DUT using a cascode arrangement in accordance with some embodiments.

Method 200 continues with operation 225 in which the output resistance of the DUT is measured. In some embodiments, the output resistance of the DUT is measured using method 700 (FIG. 7). FIG. 7 is a flowchart of method 700 of measuring an output resistance of the DUT using the cascode arrangement in accordance with some embodiments. The resistance of the DUT is measured by the cascode arrangement of FIG. 6, in some embodiments. In operation 710, a first measurement voltage is received at node A. In some embodiments, the testing equipment supplies the first measurement voltage to node A. In some embodiments, the first measurement voltage is approximately equal to Vg0. In some embodiments, the first measurement voltage is approximately equal to Vg1. In some embodiments, the first measurement voltage is different from Vg0 and Vg1.

In operation 720, a current across the cascode arrangement is measured to determine a first measurement current value, I1. A small first measurement current value helps to improve accuracy of the measured output resistance of the DUT.

In operation 730, a second measurement voltage is received at node A. In some embodiments, the testing equipment supplies the second measurement voltage to node A. The second measurement voltage is different from the first measurement voltage. In some embodiments, a difference between the first measurement voltage and the second measurement voltage is equal to about the known value of operation 210. In some embodiments, the difference between the first measurement voltage and the second measurement voltage is greater than or less than the known value of operation 210. In some embodiments, the difference between the first measurement voltage and the second measurement voltage is a pre-determined value. In some embodiments, the difference between the first measurement voltage and the second measurement voltage is selected by a user of the testing equipment during operation. In some embodiments, the difference between the first measurement voltage and the second measurement voltage is stored in the testing equipment.

In operation 740, a current across the cascode arrangement is measured to determine a second measurement current value, I2. In some embodiments, a difference between the first measurement current value and the second measurement current value is less than about 10 nanoamps (nA). In some embodiments, the first measurement current value is less than about 1 nA. A low difference between the measurement current values helps to ensure accuracy of the measured output resistance of the DUT.

In operation 750, the output resistance of the DUT is calculated based on the difference between the first measurement voltage and the second measurement voltage divided by a difference between the second measurement current value and the first measurement current value, i.e., Rout=D/(I2−I1), where Rout is the output resistance of the DUT and D is the output voltage difference between the first measurement voltage and the second measurement voltage.

Using the method and circuit arrangement described above, an output resistance of a DUT greater than 1 MΩ is able to be accurately measured. In some embodiments where a two-stage testing structure, e.g., testing structure 110 (FIG. 1), is used, an output resistance of a DUT greater than about 3,000 MΩ is accurately measurable. In some embodiments where a three-stage testing structure is used, an output resistance of a DUT greater than about 23 giga-ohms (GΩ) is accurately measurable. In some embodiments where a four-stage testing structure is used, an output resistance of a DUT of about 28 GΩ is accurately measurable. The increase in accurately measurable output resistance helps to ensure a constant current is maintained in the DUT to help ensure precise operation of the DUT.

Figure 8:
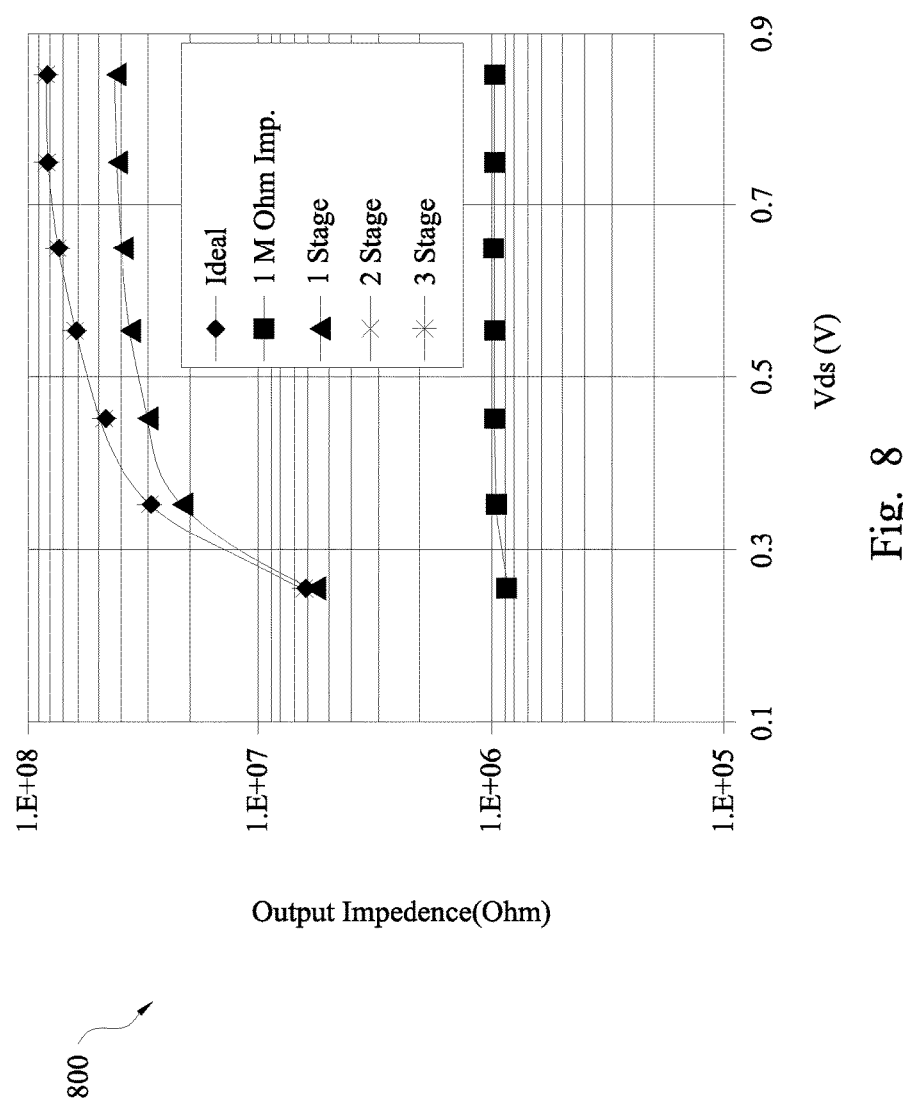
FIG. 8 is a graph of a measured output resistance versus a voltage sweep range in accordance with some embodiments.

FIG. 8 is a graph 800 of a measured output resistance versus a voltage sweep range in accordance with some embodiments. Graph 800 includes a voltage drop from a drain to a source of a transistor (Vds) along an x-axis; and a measured output resistance along a y-axis. An ideal output resistance is indicated by a plot on graph 800 having diamond shaped points. A measured resistance using other approaches which include a single transistor and have a maximum output resistance measurement of 1 MΩ is indicated by a plot on graph 800 having square shaped points. A measured resistance using a single stage cascode arrangement is indicated by a plot on graph 800 having triangular shaped points. A measured resistance using a two stage cascode testing structure, e.g., testing structure 110 (FIG. 1), is indicated by a plot on graph 800 having X-shaped points. A measured resistance using a three stage cascode testing structure is indicated by a plot on graph 800 having star shaped points.

As indicated in graph 800, a significant error exists between an ideal output resistance and the 1 MΩ output resistance measuring device. This error introduces uncertainty into whether the DUT is operating as designed. In contrast, a two stage cascode arrangement has a much smaller error with respect to the ideal output resistance. In some embodiments, the error between the ideal output resistance measurement and the output resistance measured by the two stage cascode arrangement is about 1.7%. As the number of stages in the cascode arrangement is increased to three stages, an error with respect to the ideal output resistance measurement decreases. In some embodiments, the error between the ideal output resistance measurement and the output resistance measured by the three stage cascode arrangement is about 0.2%. As a number of stages in the cascode arrangement increases, an error with respect to the ideal output resistance measurement decreases. However, as a number of stages in the cascode arrangement increases, more area is added to the circuit design of the DUT.

In some embodiments, a method of measuring an output resistance of a DUT includes determining an initial output resistance of an n-type transistor, thereby determining an initial gate voltage for the n-type transistor, determining an initial output resistance of a p-type transistor, thereby determining an initial gate voltage for the p-type transistor, determining a resistance for a cascode arrangement of the n-type transistor and the p-type transistor, and measuring the output resistance of the DUT using the cascode arrangement by biasing the n-type transistor with the initial gate voltage for the n-type transistor and biasing the p-type transistor with the initial gate voltage for the p-type transistor.

In some embodiments, a method of measuring an output resistance of a DUT includes receiving a reference current with an n-type transistor, measuring a first voltage at a gate of the n-type transistor in response to the reference current, receiving the reference current with a p-type transistor, and measuring a second voltage at a gate of the p-type transistor in response to the reference current. The method further includes measuring the output resistance of the DUT by configuring the n-type transistor and the p-type transistor in a cascode arrangement, receiving the reference current with the cascode arrangement, operating the n-type transistor in the cascode arrangement by applying the first voltage at the gate of the n-type transistor, and operating the p-type transistor in the cascode arrangement by applying the second voltage at the gate of the p-type transistor.

In some embodiments, a method of measuring an output resistance of a DUT includes using testing equipment to, for each transistor of an n-type transistor and a p-type transistor, connect a drain terminal of the transistor to a gate of the transistor, supply a reference current to the drain terminal of the transistor, and measure a gate voltage at the gate of the transistor. The method further includes using the testing equipment to connect the drain terminal of the n-type transistor to the drain terminal of the p-type transistor, supply the reference current to a source terminal of one of the n-type transistor or the p-type transistor, supply each of the measured gate voltages to corresponding gates of the n-type transistor and the p-type transistor, supply first and second voltage values at the connected drain terminals, and measure respective first and second current values in response to the first and second voltage values.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of measuring an output resistance of a device under test (DUT), the method comprising:
   determining an initial output resistance of an n-type transistor, thereby determining an initial gate voltage for the n-type transistor;
   determining an initial output resistance of a p-type transistor, thereby determining an initial gate voltage for the p-type transistor;
   determining a resistance for a cascode arrangement of the n-type transistor and the p-type transistor, wherein a drain terminal of the n-type transistor is connected to a drain terminal of the p-type transistor; and measuring the output resistance of the DUT using the cascode arrangement by
biasing the n-type transistor with the initial gate voltage for the n-type transistor, and
biasing the p-type transistor with the initial gate voltage for the p-type transistor.

2. The method of claim 1, wherein the determining the initial output resistance of the n-type transistor comprises:
measuring a first current value of the n-type transistor using a first voltage applied to the drain terminal of the n-type transistor;
measuring a second current value of the n-type transistor using a second voltage applied to the drain terminal of the n-type transistor; and
calculating the initial output resistance of the n-type transistor using the first current value and the second current value.

3. The method of claim 1, wherein the determining the initial gate voltage for the n-type transistor comprises connecting a gate of the n-type transistor to the drain terminal of the n-type transistor.

4. The method of claim 1, wherein the determining the initial output resistance of the p-type transistor comprises connecting a gate of the p-type transistor to the drain terminal of the p-type transistor.

5. The method of claim 1, wherein the measuring the output resistance of the DUT comprises:
receiving a first measurement voltage at a node of the cascode arrangement;
measuring a first current across the cascode arrangement;
receiving a second measurement voltage at the node of the cascode arrangement;
measuring a second current across the cascode arrangement; and
calculating the output resistance of the DUT using a difference between the first measurement voltage and the second measurement voltage, and a difference between the first current and the second current.

6. The method of claim 5, wherein the difference between the first current and the second current is less than 10 nanoamps (nA).

7. A method of measuring an output resistance of a device under test (DUT), the method comprising:
receiving a reference current with an n-type transistor;
measuring a first voltage at a gate of the n-type transistor in response to the reference current;
receiving the reference current with a p-type transistor;
measuring a second voltage at a gate of the p-type transistor in response to the reference current; and
measuring the output resistance of the DUT by
configuring the n-type transistor and the p-type transistor in a cascode arrangement, wherein a drain terminal of the n-type transistor is connected to a drain terminal of the p-type transistor,
receiving the reference current with the cascode arrangement,
operating the n-type transistor in the cascode arrangement by applying the first voltage at the gate of the n-type transistor, and
operating the p-type transistor in the cascode arrangement by applying the second voltage at the gate of the p-type transistor.

8. The method of claim 7, wherein at least one of the receiving the reference current with the n-type transistor or the receiving the reference current with the p-type transistor comprises receiving the reference current with the drain terminal of the corresponding transistor connected to the gate of the corresponding transistor by a programmable e-fuse.

9. The method of claim 8, further comprising blowing the programmable e-fuse prior to the measuring the output resistance of the DUT.

10. The method of claim 7, wherein the measuring the output resistance of the DUT is further by
receiving a voltage step at a node of the cascode arrangement,
measuring a current difference based on the voltage step, and
dividing a size of the voltage step by the measured current difference.

11. The method of claim 10, wherein the size of the voltage step is a predetermined value.

12. The method of claim 7, wherein the receiving the reference current with the cascode arrangement comprises:
receiving the reference current at a source terminal of the p-type transistor; and
receiving a reference voltage at a source terminal of the n-type transistor.

13. The method of claim 12, further comprising measuring a voltage level at the source terminal of the p-type transistor.

14. A method of measuring an output resistance of a device under test (DUT), the method comprising:
using testing equipment to:
for each transistor of an n-type transistor and a p-type transistor:
connect a drain terminal of the transistor to a gate of the transistor;
supply a reference current to the drain terminal of the transistor; and
measure a gate voltage at the gate of the transistor;
connect the drain terminal of the n-type transistor to the drain terminal of the p-type transistor;
supply the reference current to a source terminal of one of the n-type transistor or the p-type transistor;
supply each of the measured gate voltages to corresponding gates of the n-type transistor and the p-type transistor;
supply first and second voltage values at the connected drain terminals; and
measure respective first and second current values in response to the first and second voltage values.

15. The method of claim 14, wherein each of the using the testing equipment to supply the reference current to the drain terminal of the transistor and using the testing equipment to supply the reference current to the source terminal of one of the n-type transistor or the p-type transistor comprises supplying the reference current having a magnitude sufficient to maintain the DUT in a saturation region.

16. The method of claim 14, further comprising storing at least one of the measured gate voltages in a non-transitory computer readable medium.

17. The method of claim 14, wherein the using the testing equipment to supply the first voltage value comprises supplying a voltage value approximately equal to one of the measured gate voltages.

18. The method of claim 14, further comprising, after supplying the reference current to the source terminal of the one of the n-type transistor or the p-type transistor, measuring a voltage level at the source terminal of the one of the n-type transistor or the p-type transistor.

19. The method of claim 14, wherein a value corresponding to a difference between the first and second voltage values is either stored in the testing equipment or selected by a user of the testing equipment.

20. The method of claim 14, further comprising calculating the output resistance of the DUT by dividing a difference between the first and second voltage values by a difference between the first and second measured current values.

* * * * *